United States Patent
Lee et al.

(10) Patent No.: US 9,269,719 B2
(45) Date of Patent: Feb. 23, 2016

(54) SEMICONDUCTOR DEVICE AND METHOD OF MANUFACTURING THE SAME

(71) Applicant: SK hynix Inc., Icheon-si Gyeonggi-do (KR)

(72) Inventors: Ki Hong Lee, Suwon-si (KR); Seung Ho Pyi, Seongnam-si (KR); Jin Ho Bin, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/718,840

(22) Filed: Dec. 18, 2012

(65) Prior Publication Data

US 2014/0103417 A1    Apr. 17, 2014

(30) Foreign Application Priority Data

Oct. 16, 2012    (KR) .................. 10-2012-0114868

(51) Int. Cl.
| | |
|---|---|
| *H01L 27/115* | (2006.01) |
| *H01L 29/78* | (2006.01) |
| *H01L 29/792* | (2006.01) |
| *H01L 29/66* | (2006.01) |
| *H01L 27/108* | (2006.01) |

(52) U.S. Cl.
CPC .... *H01L 27/11556* (2013.01); *H01L 27/10802* (2013.01); *H01L 27/1157* (2013.01); *H01L 27/11521* (2013.01); *H01L 27/11568* (2013.01); *H01L 27/11573* (2013.01); *H01L 27/11578* (2013.01); *H01L 27/11582* (2013.01); *H01L 29/66666* (2013.01); *H01L 29/7827* (2013.01); *H01L 29/792* (2013.01); *H01L 27/11524* (2013.01)

(58) Field of Classification Search
CPC ............ H01L 27/108; H01L 27/10897; H01L 27/1128; H01L 27/11514; H01L 27/11526; H01L 27/11529; H01L 27/10802; H01L 27/11521; H01L 27/11556; H01L 27/11568; H01L 27/11573; H01L 27/11578
USPC ........... 257/74, 202, 211, 314, 324, 328, 331, 257/E27.108, E29.026, E29.028
See application file for complete search history.

(56) References Cited

U.S. PATENT DOCUMENTS

| | | | | |
|---|---|---|---|---|
| 8,178,919 | B2 * | 5/2012 | Fujiwara et al. | 257/324 |
| 8,334,561 | B2 * | 12/2012 | Fukuzumi et al. | 257/326 |
| 8,349,689 | B2 * | 1/2013 | Lee et al. | 438/268 |
| 8,378,412 | B2 * | 2/2013 | Goda | 257/328 |
| 8,654,579 | B2 * | 2/2014 | Kim et al. | 365/184 |
| 8,692,314 | B2 * | 4/2014 | Lee et al. | 257/324 |
| 2010/0213538 | A1 * | 8/2010 | Fukuzumi et al. | 257/326 |
| 2013/0100722 | A1 * | 4/2013 | Shin | H01L 27/11582 365/51 |
| 2013/0105883 | A1 * | 5/2013 | Lee et al. | 257/324 |
| 2013/0320424 | A1 * | 12/2013 | Lee et al. | 257/314 |
| 2015/0098274 | A1 * | 4/2015 | Rhie | G11C 16/0483 365/185.17 |

FOREIGN PATENT DOCUMENTS

KR    1020110131795 A    12/2011

* cited by examiner

*Primary Examiner* — Eduardo A Rodela
(74) *Attorney, Agent, or Firm* — William Park & Associates Ltd.

(57) ABSTRACT

A semiconductor device includes a pipe gate, word lines stacked on the pipe gate, first channel layers configured to pass through the word lines, and a second channel layer formed in the pipe gate to connect the first channel layers and having a higher impurity concentration than the first channel layers.

17 Claims, 6 Drawing Sheets

SEMICONDUCTOR DEVICE AND METHOD OF MANUFACTURING THE SAME

CROSS-REFERENCE TO RELATED APPLICATION

This application claims priority to and the benefit of Korean Patent Application No. 10-2012-0114868, filed Oct. 16, 2012, the disclosure of which is incorporated herein by reference in its entirety.

BACKGROUND

The present invention relates generally to a semiconductor device and a method of manufacturing the same, and more specifically, to a three-dimensional (3D) nonvolatile memory device and a method of manufacturing the same.

DISCUSSION OF RELATED ART

A nonvolatile memory device is a memory device in which data stored therein can be retained even when power is cut off. Recently, as improvements regarding integration degree for two-dimensional (2D) memory devices, in which a memory cell is formed on a single layer of a substrate, have reached a limit, a three-dimensional (3D) nonvolatile memory device in which memory cells are stacked on a substrate has been introduced.

A 3D nonvolatile memory device is manufactured by stacking memory cells by arranging strings vertically on a substrate or arranging the strings on the substrate in a 'U' shape manner, in which each of the strings includes a drain select transistor, drain-side memory cells, a pipe transistor, source-side memory cells, and a source select transistor all connected in series.

The pipe transistor connects the drain-side memory cells and the source-side memory cells. However, the pipe transistor is difficult to manufacture since the pipe transistor is located below the stacked drain-side memory cells and source-side memory cells. In particular, during a manufacturing process, a channel layer of the pipe transistor may be cut off or a threshold voltage may not be appropriately controlled, thereby lowering the operational reliability of the memory device.

SUMMARY OF THE INVENTION

The present invention is directed to a semiconductor device having improved operational reliability, and a method of manufacturing the same.

One aspect of the present invention provides a semiconductor device including a pipe gate, word lines stacked on the pipe gate, first channel layers configured to pass through the word lines, and a second channel layer formed in the pipe gate to connect the first channel layers and having a higher impurity concentration than the first channel layers.

Another aspect of the present invention provides a semiconductor device including source-side memory cells stacked along a first source-side channel layer, drain-side memory cells stacked along a first drain-side channel layer, and a conductive layer configured to connect the first source-side channel layer and the first drain-side channel layer.

Another aspect of the present invention provides a method of manufacturing a semiconductor device, the method including: forming a trench by etching a first conductive layer, forming a sacrificial layer in the trench, alternately forming first material layers and second material layers on the first conductive layer in which the sacrificial layer is formed, forming channel holes to be connected to the trench by etching the first material layers and the second material layers, removing the sacrificial layer exposed via bottom surfaces of the channel holes, forming first channel layers in the channel holes and a second channel layer in the trench by forming a channel layer in the channel holes and the trench, forming a slit by etching the first material layers and the second material layers between the channel holes, and implanting impurities into the second channel layer via the slit.

BRIEF DESCRIPTION OF THE DRAWINGS

The above and other features and advantages of the present invention will become more apparent to those of ordinary skill in the art by describing in detail various embodiments thereof with reference to the attached drawings in which.

DETAILED DESCRIPTION OF EMBODIMENTS

Hereinafter, various embodiments of the present invention will be described more fully with reference to the accompanying drawings. In the drawings, the thicknesses of and intervals between layers and regions may have been exaggerated for clarity. In the following disclosure, well-known functions or constructions are not described in detail if they obscure the invention due to unnecessary detail. Throughout the drawings, whenever the same element reappears in a subsequent drawing, it is denoted by the same reference numeral.

FIGS. 1A to 1D are cross-sectional views of semiconductor devices according to various embodiments of the present invention.

Figure 1A:
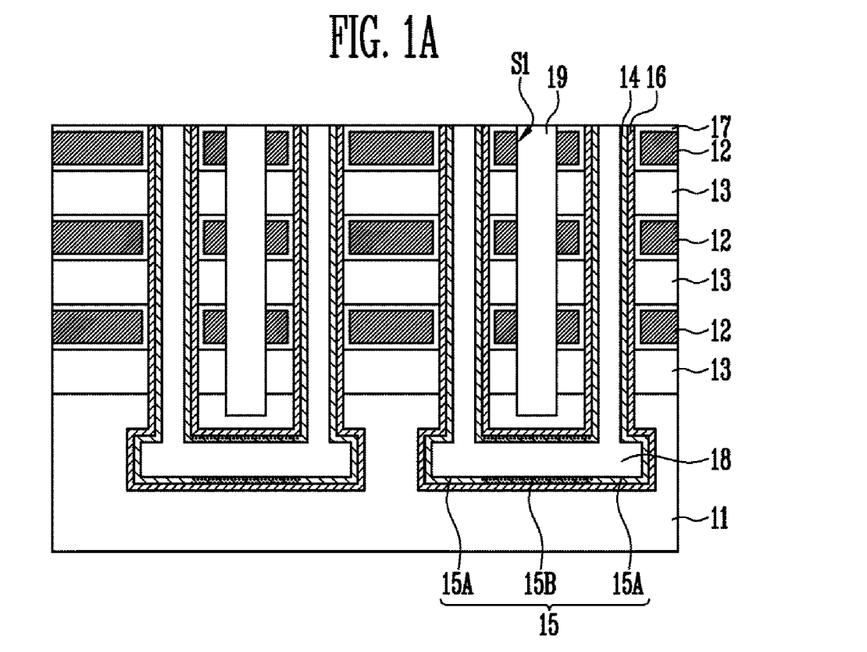
FIGS. 1A to 1D are cross-sectional views of semiconductor devices according to various embodiments of the present invention.

Referring to FIG. 1A, a semiconductor device according to an embodiment of the present invention includes a pipe gate 11, word lines 12 stacked on the pipe gate 11, first channel layers 14 formed to pass through the word lines 12, and a second channel layer 15 formed in the pipe gate 11 to connect the first channel layers 14 and having a higher impurity concentration than the first channel layers 14.

The first channel layers 14 may be used as channel layers of stacked memory cells, and may each be formed of an undoped polysilicon layer.

The second channel layer 15 is formed to connect adjacent first channel layers 14. For example, the second channel layer 15 connects lower portions of a first drain-side channel layer and a first source-side channel layer that are adjacent to each other both within first channel layers 14.

The second channel layer 15 may include first regions 15A in contact with the first channel layers and a second region 15B disposed between the first regions 15A, and may be formed of a doped polysilicon layer. The second channel layer 15 includes impurities at a higher concentration than impurities in the first channel layers 14, and the second region 15B may include impurities at a higher concentration than impurities in the first region 15A. For example, the first regions 15A may not include impurities and the second region 15B may include N or P type impurities. As another example, the first regions 15A may include low-concentration N or P type impurities, and the second region 15B may include high-concentration N or P type impurities.

The first and second channel layers 14 and 15 may each have a tubular shape, and collectively form central regions of which are open. The open central regions of the first and second channel layers 14 and 15 may be filled with an insulating layer 18.

The pipe gate 11 is formed to surround the second channel layer 15. For example, the pipe gate 11 may be formed to surround all or some of the upper, side, and lower surfaces of the second channel layer 15. The pipe gate 11 may be formed of a conductive layer, e.g., a polysilicon layer.

The semiconductor device may further include a first memory layer 16 surrounding the first and second channel layers 14 and 15. The first memory layer 16 may include all or some of a tunneling insulating layer, a charge storing layer, and a charge blocking layer that are disposed among the first and second channel layers 14 and 15 and the word lines 12. The charge storing layer may include at least one among a floating gate for storing electric charges, e.g., a floating gate, a trapping layer for trapping electric charges, e.g., a nitride layer, and nano dots. The semiconductor device may include a phase-change material layer instead of the charge storing layer.

The semiconductor device may further include a second memory layer 17 that is disposed between the first memory layer 16 and the word lines 12 and that surrounds upper and lower surfaces of the word lines 12. The second memory layer 17 may include all or some of a tunneling insulating layer, a charge storing layer, and a charge blocking layer. For example, the second memory layer 17 may include a charge blocking layer obtained by stacking an oxide layer and a high-k dielectric material layer.

The semiconductor device may further include a first slit S1 that passes through the word lines 12 and interlayer insulating layers 13 that are alternately stacked between the word lines 12. The first slit S1 is disposed between channel holes and above the second region 15B of the second channel layer 15. The first slit S1 may be formed to a depth such that a surface of the pipe gate 11 is exposed via the first slit S1 or such that an upper surface of the pipe gate 11 is over-etched. The first slit S1 is then filled with an insulating layer 19.

Figure 1B:
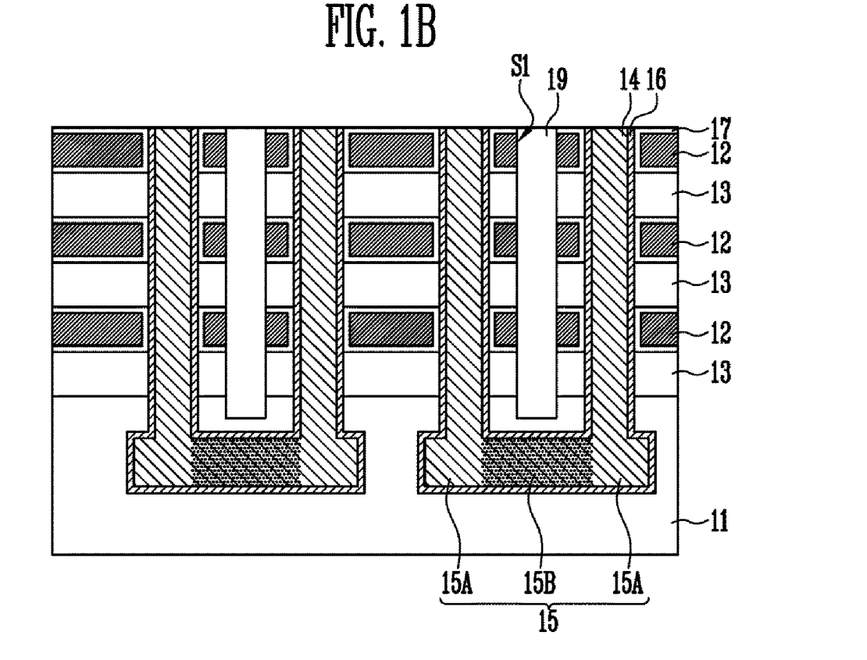

Referring to FIG. 1B, a semiconductor device according to another embodiment of the present invention includes first and second channel layers 14 and 15 each formed in a pillar shape manner, an entire region, including a central region, of which is not open. Other structures of the semiconductor device of FIG. 1B are substantially similar as those of the semiconductor device illustrated in FIG. 1A.

Figure 1C:
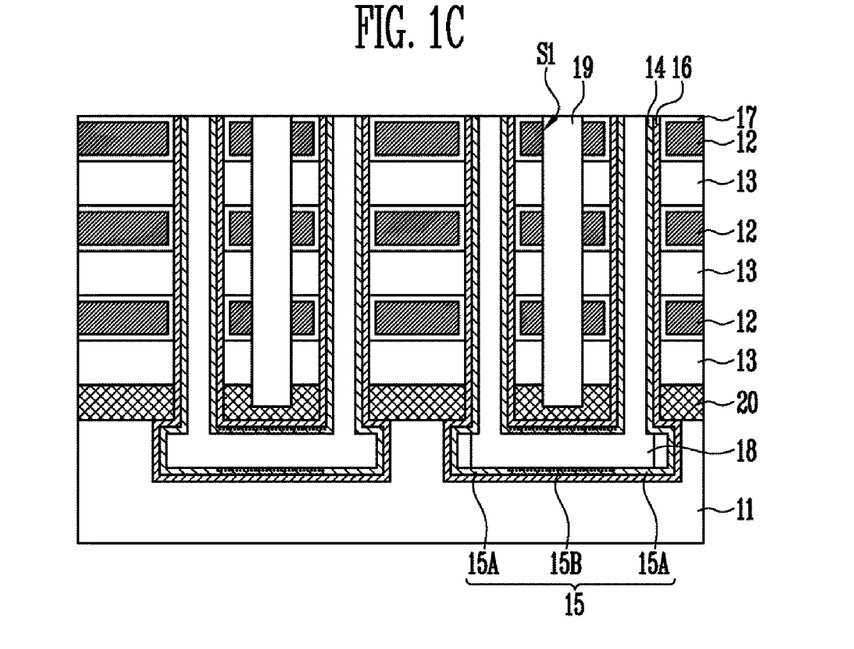

Referring to FIG. 1C, a semiconductor device according to another embodiment of the present invention includes a pipe gate 11 surrounding side and lower surfaces of a second channel layer 15. The distinguishing feature in comparison with an embodiment described in FIG. 1A is a dummy pipe gate 20 formed on the pipe gate 11 that surrounds an upper surface of the second channel layer 15.

In FIG. 1C, the pipe gate 11 may be formed of a conductive layer, e.g., a doped polysilicon layer, and the dummy pipe gate 20 may be formed of a non-conductive layer, e.g., an undoped polysilicon layer. Since the dummy pipe gate 20 is formed of the non-conductive layer, only the pipe gate 11 substantially functions as a gate. The dummy pipe gate 20 may be used as an etch barrier during etching of a first slit 51.

Word lines 12 and interlayer insulating layers 13 are alternately stacked on the dummy pipe. Although FIG. 1C illustrates that the interlayer insulating layers 13 and the word lines 12 are sequentially and alternately stacked on the pipe gate 11, the word lines 12 and the interlayer insulating layers 13 may be sequentially and alternately stacked on the dummy pipe gate 20. When one of the word lines 12 is stacked directly on the dummy pipe gate 20, the second memory layer 17 may be disposed between the dummy pipe gate 20 and the word line 12 to function as an interlayer insulating layer.

Other structures of the semiconductor device of FIG. 1C are substantially similar as those of the semiconductor device illustrated in FIG. 1A.

Figure 1D:
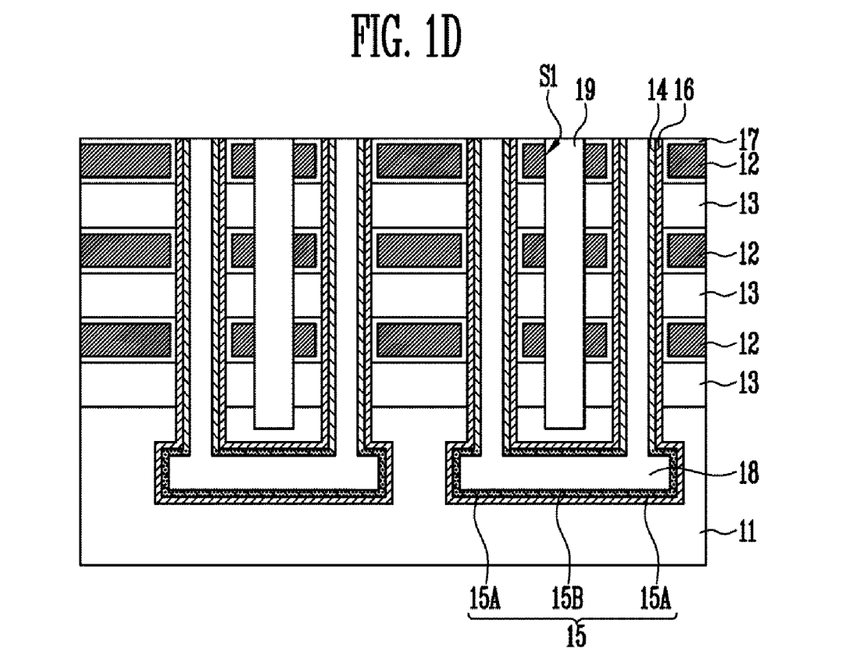

Referring to FIG. 1D, in a semiconductor device according to another embodiment of the present invention, impurities included in first regions 15A and a second region 15B of a second channel layer 15 all have the same concentration.

For example, the first and second regions 15A and 15B each include low-concentration N or P type impurities. In this case, a threshold voltage of a pipe transistor is lowered to improve a variation in the threshold voltage that may occur during a program/erase operation.

As another example, the first and second regions 15A and 15B may each include high-concentration impurities. In this case, the second channel layer 15 exhibits conductive properties, thus maintaining connectivity between a pair of a first drain-side channel layer 14 and a first source-side channel layer 14 that are adjacent to each. In other words, the pipe transistor remains turned on.

When the second channel layer 15 exhibits conductive properties, the pair of the first drain-side channel layer 14 and the first source-side channel layer 14 remain connected and the pipe gate 11 may subsequently be replaced with an insulating layer.

As described above, since the impurities in the second channel layer 15 may be at a higher concentration than impurities in the first channel layers 14, the threshold voltage of the pipe transistor may be lowered to improve a variation in the threshold voltage that may occur during the program/erase operation. Also, the second region 15B of the second channel layer 15 is configured to have conductive properties due to high-concentration impurities therein, so that current may easily flow through it even when some portions of the second channel layer 15 agglomerate to prevent the second channel layer 15 from being evenly formed during manufacture of the semiconductor device.

Figure 2A:
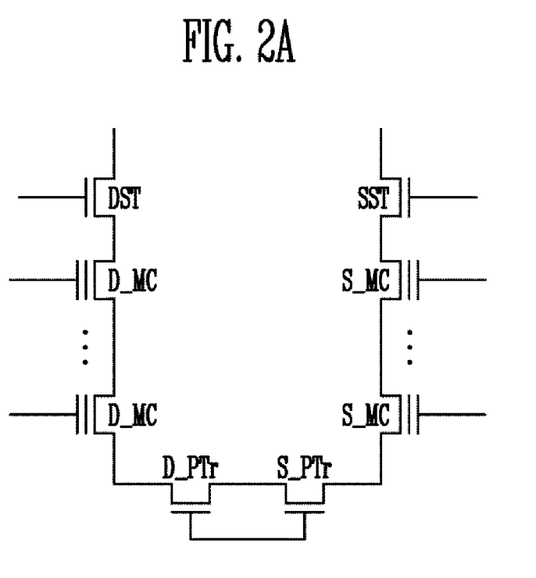
FIGS. 2A and 2B are circuit diagrams illustrating parts of cell arrays of semiconductor devices according to various embodiments of the present invention.
Figure 2B:
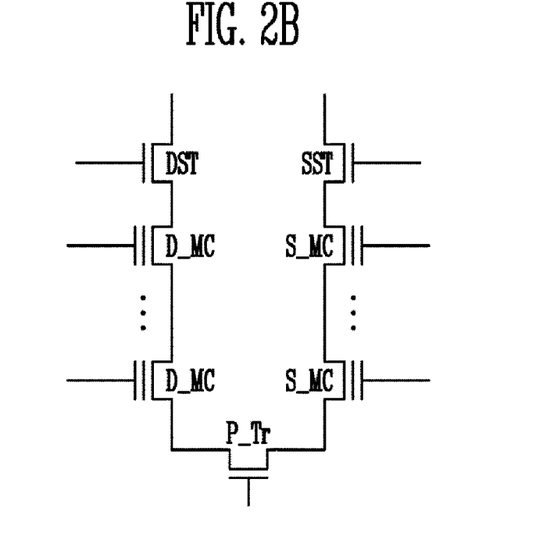

FIGS. 2A and 2B are circuit diagrams illustrating parts of cell arrays of semiconductor devices according to various embodiments of the present invention.

Referring to FIGS. 2A and 2B, semiconductor devices according to embodiments of the present invention include strings arranged in a U shape manner. Each of the strings includes at least one drain select transistor DST, drain-side memory cells D_MC, pipe transistors P_Tr and D_PTr (or a pipe transistor S_PTr), source-side memory cells S_MC, and at least one source select transistor SST that are all connected in series.

The drain-side memory cells D_MC are memory cells stacked along a first drain-side channel layer 14 among a pair of first channel layers 14 connected via one second channel layer 15 as shown in one of FIGS. 1A to 1D. The source-side memory cells S_MC are memory cells stacked along the other first source-side channel layer 14.

As illustrated in FIG. 2A, one string may include a plurality of pipe transistors D_PTr and S_PTr.

In the case of the semiconductor device described above with reference to one of FIGS. 1A to 1C, impurities in the second region 15B of the second channel layer 15 may be at a higher concentration than impurities in the first regions 15A. In particular, when the second region 15B includes high-concentration impurities, the second region 15B has conductive properties. Furthermore, the first regions 15A of the second channel layer 15 include low-concentration impurities or do not include impurities, and have semiconductor properties.

Thus, the first region 15A connected to the first drain-side channel layer 14 includes the drain-side pipe transistor D_PTr, and the first region 15A connected to the first source-side channel layer 14 includes the source-side pipe transistor S_PTr. A first region channel layer of the drain-side pipe transistor D_PTr and a first region channel layer of the source-side pipe transistor S_PTr are connected via a second region conductive layer. Also, the drain-side pipe transistor D_PTr and the source-side pipe transistor S_PTr share the pipe gate 11 shown in FIGS. 1A to 1D as a gate electrode and are controlled simultaneously.

As illustrated in FIG. 2B, one string may include one pipe transistor P_Tr that is turned on.

In the case of the semiconductor device described above with reference to FIG. 1D, the first and second regions 15A and 15B of the second channel layer 15 may include high-concentration impurities. In this case, the entire second channel layer 15 has conductive properties. Thus, the pipe transistor P_Tr remains turned on.

FIGS. 3A to 3D are cross-sectional views of a method of manufacturing a semiconductor device according to another embodiment of the present invention.

Figure 3A:
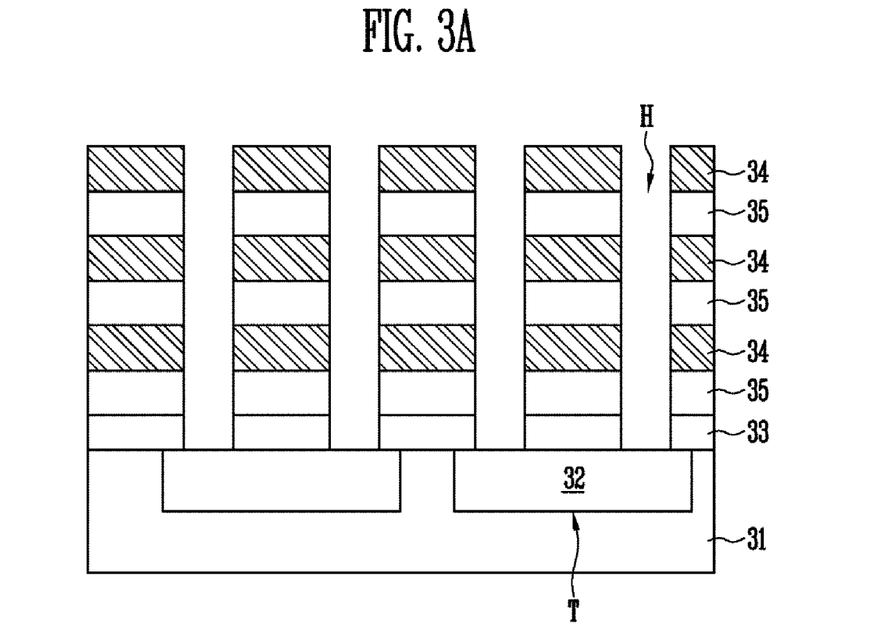
FIGS. 3A to 3D are cross-sectional views of a method of manufacturing a semiconductor device according to an embodiment of the present invention.

Referring to FIG. 3A, a first conductive layer 31 for a pipe gate is formed and is then etched to form trenches T. The trenches T are subsequently filled with a sacrificial layer 32. For example, the sacrificial layer 32 may include at least one of a nitride layer and a titanium nitride layer.

A second conductive layer 33 for a pipe gate is then formed on the first conductive layer 31 having the trenches T filled with the sacrificial layer 32. Alternatively, a non-conductive layer for a dummy pipe gate may be formed instead of the second conductive layer 33 for a pipe gate. For example, the non-conductive layer for a dummy pipe gate may be formed of an undoped polysilicon layer.

First material layers 34 and second material layers 35 are alternately formed on the second conductive layer 33 for a pipe gate. The first material layers 34 are formed to form word lines or conductive layers for a select line. The second material layers 35 are formed to isolate stacked conductive layers from each another. For example, a second material layer 35 is first formed on the second conductive layer 33 for a pipe gate, and the first material layer 34 is formed on the second material layer 35. As another example, a first material layer 34 is formed on the non-conductive layer for a dummy pipe gate, and a second material layer 35 is formed on the first material layer 34.

The first material layers 34 and the second material layers 35 are formed of materials having a high etch selectivity to each other. For example, the first material layers 34 may each be formed of a conductive layer, e.g., a polysilicon layer, and the second material layers 35 may each be formed of an insulating layer, e.g., an oxide layer. As another example, the first material layers 34 may each be formed of a conductive layer, e.g., a doped polysilicon layer or a doped amorphous silicon layer, and the second material layers 35 may each be formed of a sacrificial layer, e.g., an undoped polysilicon layer or an undoped amorphous silicon layer. As another example, the first material layers 34 may each be formed of a sacrificial layer, e.g., a nitride layer, and the second material layers 35 may each be formed of an insulating layer, e.g., an oxide layer.

The first and second material layers 34 and 35 are then etched to form channel holes H connected to the trenches T. For example, the channel holes H are formed such that a pair of channel holes H are connected to each of the trenches T.

Figure 3B:
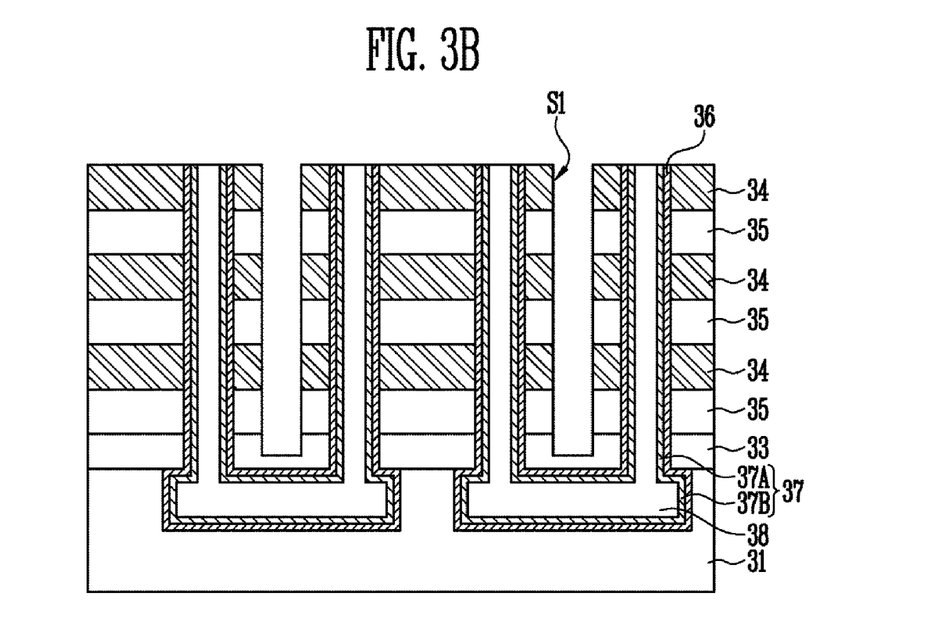

Referring to FIG. 3B, the sacrificial layer 32 exposed via bottom surfaces of the channel holes H is removed. Subsequently, a first memory layer 36 is formed along inner surfaces of the trenches T and the channel holes H. For example, the first memory layer 36 includes a charge storing layer, a tunneling insulating layer, and an optional charge blocking layer.

A channel layer 37 is formed on the first memory layer 36. The channel layer 37 may be formed of a polysilicon layer or the like. Portions of the channel layer 37 formed in the channel holes H function as select transistors or first channel layers 37A of memory cells, and portions of the channel layer 37 formed in the trenches T function as second channel layers 37B of a pipe transistor.

Alternatively, the channel layer 37 may be formed in a tubular shaped manner, the central region of which is open, or in a pillar shaped manner, where the entire region, including a central region, is not open. The open central region of the channel layer 37 may be filled with an insulating layer 38.

The first and second material layers 34 and 35 are etched to form a first slit S1. The first slit S1 is formed to isolate gate electrodes of source-side memory cells and drain-side memory cells formed in one string from one another. Thus, the first slit S1 is located between the channel holes H, and particularly, above the second channel layer 37B. The first slit S1 is formed to a depth such that a surface of the second conductive layer 33 for a pipe gate is exposed via the first slit S1. In this case, the first slit S1 may be etched by an over etching process such that a portion of the second conductive layer 33 is etched.

Figure 3C:
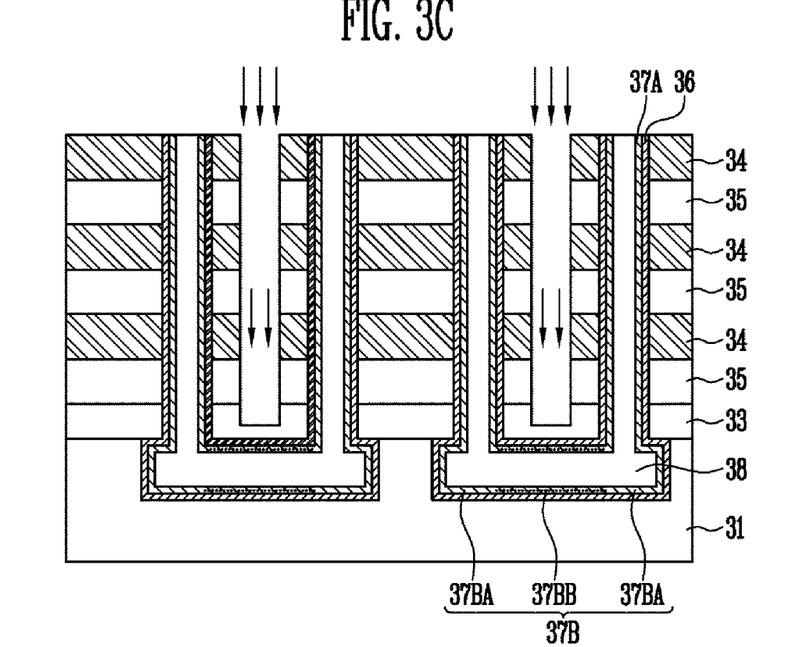

Referring to FIG. 3C, impurities are implanted via the first slit S1, as indicated by arrows. For example, the impurities may be N or P type impurities. The implanting of the impurities may be performed using plasma doping or an ion implantation process. In this case, the impurities are implanted into the second channel layer 37B located at a bottom surface of the first slit S1, and a depth and concentration at which the impurities are implanted may be controlled according to conditions of an impurity implanting process.

For example, impurities are implanted into a second region 37BB of the second channel layer 37B using the ion implantation process. The impurities may be implanted into the second region 37BB of the second channel layer 37B at a high concentration or low concentration. In this case, the second channel layer 37B includes first regions 37BA formed of an undoped polysilicon layer, and the second region 37BB formed of a polysilicon layer including high or low-concentration impurities.

As another example, impurities are implanted into the second region 37BB of the second channel layer 37B using the ion implantation process, and the impurities implanted into the second region 37BB are diffused into the first regions 37BA using a thermal treatment process. In this case, the second channel layer 37B includes the first regions 37BA including low-concentration impurities and the second region 37BB including high-concentration impurities. Otherwise, the second channel layer 37B includes the first and second regions 37BA and 37BB each including low or high-concentration impurities.

Figure 3D:
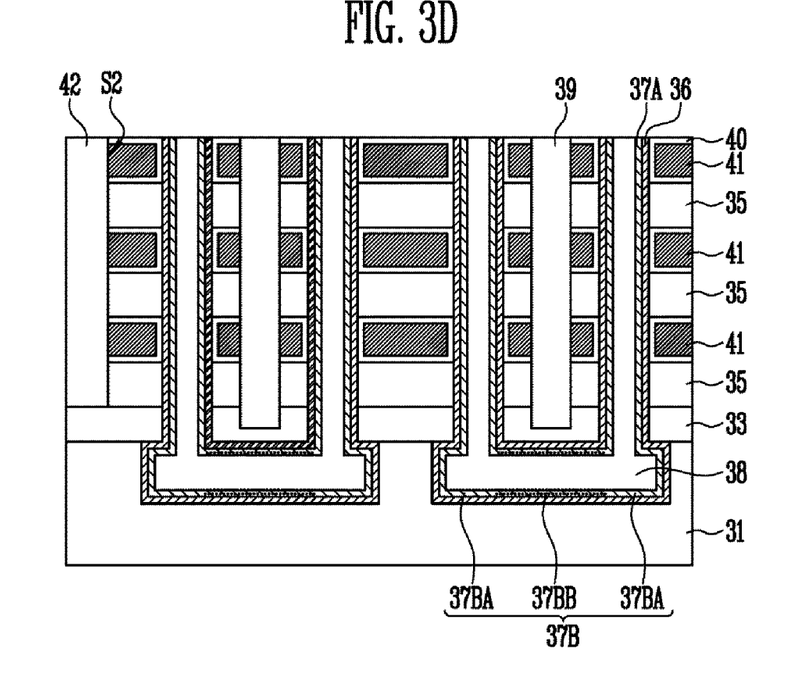

Referring to FIG. 3D, the first and second material layers 34 and 35 are etched to form a second slit S2. The second slit S2 is formed to a depth such that the first material layers 34 are completely exposed via the second slit S2.

The first material layers 34 exposed via the first and second slits S1 and S2 are then removed to form recessed regions that are each filled with a conductive layer 41. At least one uppermost conductive layer 41 among the stacked conductive layers 41 may be used as a select line, and the other conductive layers 41 may be used as word lines. In this case, before the recessed regions are each filled with the conductive layer 41, second memory layers 40 may be further formed in the recessed regions. The second memory layers 40 may each include a charge blocking layer.

The first slit S1 is filled with an insulating layer 39, and the second slit S2 is filled with an insulating layer 42. Although the first slit S1 and the second slit S2 are formed using separate processes, they may be formed simultaneously. The second slits S2 may be filled with an insulating layer and an impurity implantation process may be formed on the resultant structure. Otherwise, after the first material layers 34 are replaced with conductive layers 41 by forming the first and second slits S1 and S2, impurities may be implanted via the first slit S1.

The processes described above may partially vary according to materials used to form the first and second material layers 34 and 35. In particular, the processes subsequent to the forming of the second slit S2 may be partially changed.

For example, when the first material layer 34 is formed of a conductive layer and the second material layer 35 is formed of an interlayer insulating layer, the first material layers 34 exposed in the second slit S2 may be silicided after the second slit S2 is formed, at which point the insulating layer 42 is then formed in the second slit S2.

As another example, when the first material layer 34 is formed of a conductive layer and the second material layer 35 is formed of a sacrificial layer, the second material layers 35 exposed in the second slit S2 are removed to form recessed regions. The first material layers 34 exposed in the second slit S2 are silicided, and the insulating layer 42 is formed in the recessed regions and the second slit S2.

According to the processes described above, a threshold voltage of the pipe transistor may be easily controlled by implanting impurities into the second channel layer 37B via the first slit S1. In particular, since the second region 37BB of the second channel layer 37B is configured to have conductive properties, a portion of the pipe transistor corresponding to the second region 37BB of the second channel layer 37B may remain turned on. Thus, even if the second channel layer 37B agglomerates during the manufacture of the semiconductor device, the first channel layers 37A may be easily connected via the second region 37BB having conductive properties.

Figure 4:
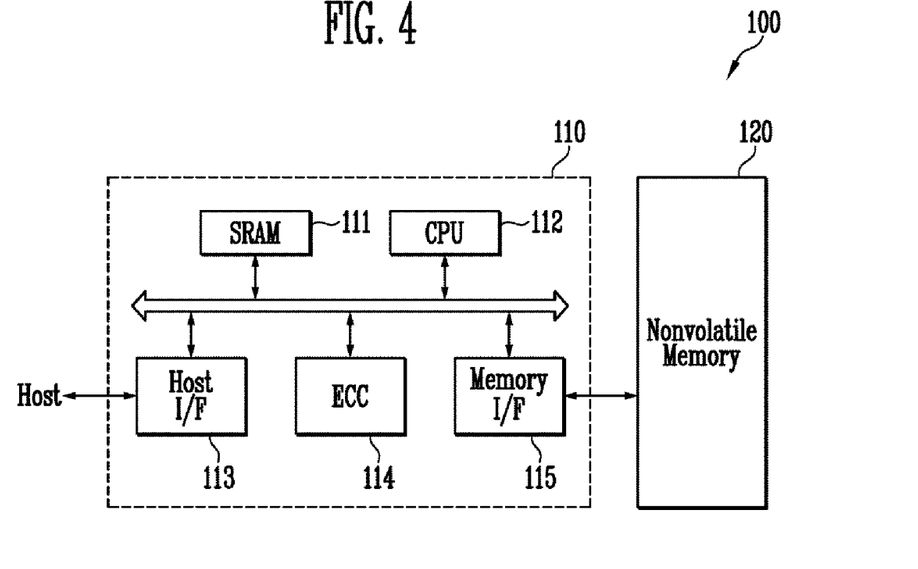
FIG. 4 is a block diagram of a memory system according to an another embodiment of the present invention.

FIG. 4 is a block diagram of a memory system 100 according to an embodiment of the present invention.

Referring to FIG. 4, the memory system 100 includes a nonvolatile memory device 120 and a memory controller 110.

The nonvolatile memory device 120 may either have a structure as described in embodiments of the present invention, or may exhibit a multi-chip package including a plurality of flash memory chips.

The memory controller 110 is configured to control the nonvolatile memory device 120, and may include a static random access memory (SRAM) 111, a central processing unit (CPU) 112, a host interface 113, an error correcting code (ECC) unit 114, and a memory interface 115. The SRAM 111 is used as an operating memory of the CPU 112. The CPU 112 performs overall control operations to exchange data between the memory controller 110 and the nonvolatile memory device 120. The host interface 113 includes a data exchange protocol of a host connected to the memory system 100. The ECC 114 unit detects and corrects errors in data read from the nonvolatile memory device 120. The memory interface 115 interfaces with the nonvolatile memory device 120. The memory controller 110 may further include a read only memory (ROM) configured to store code data for interfacing with the host, and the like.

The memory system 100 having a structure as described above may be a memory card or a solid-state disk (SSD) that is a combination of the nonvolatile memory device 120 and the memory controller 110. For example, if the memory system 100 is the SSD, the memory controller 110 may communicate with the host via one of various interface protocols, e.g., Universal Serial Bus (USB), Multi Media Card (MMC), Peripheral Component Interconnect Express (PCI-E), Serial Advanced Technology Attachment (SATA), Parallel Advanced Technology Attachment (PATA), Small Computer System Interface (SCSI), Enhanced Small Device Interface (ESDI), and Integrated Drive Electronics (IDE).

Figure 5:
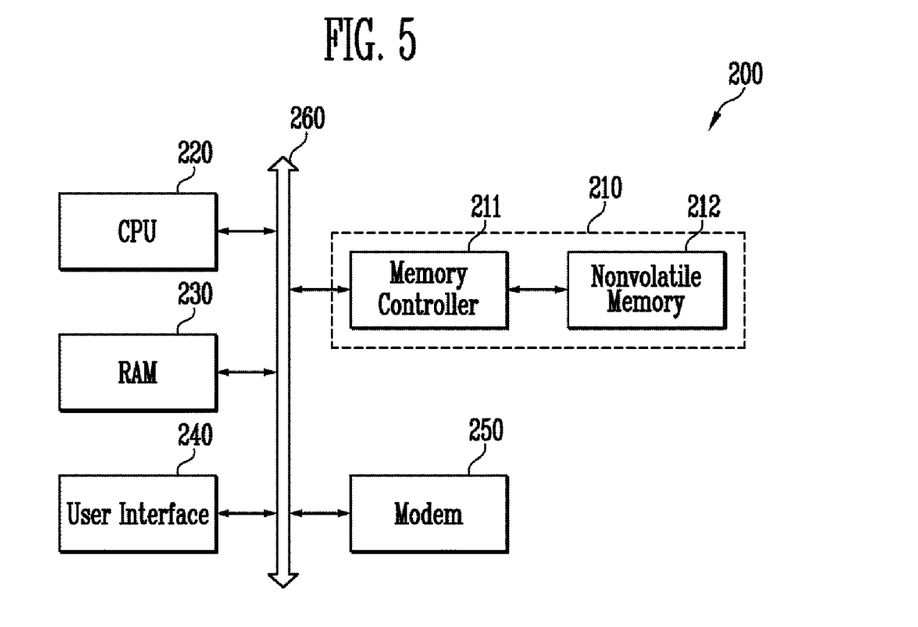
FIG. 5 is a block diagram of a computing system according to another embodiment of the present invention.

FIG. 5 is a block diagram of a computing system 200 according to an embodiment of the present invention.

Referring to FIG. 5, the computing system 200 may include a CPU 220, a random access memory (RAM) 230, a user interface 240, a modem 250, and a memory system 210 that are connected via a system bus 260. Although not shown, when the computing system 200 is a mobile device, the computing system 200 may further include a battery for supplying an operating voltage to the computing system 200, an application chipset, a camera image processor (CIS), and a mobile dynamic random access memory (DRAM).

The memory system 210 may include a nonvolatile memory 212 and a memory controller 211 as described above with reference to FIG. 4.

As described above, a variation in a threshold voltage that may occur during a program/erase process may be improved by lowering a threshold voltage of a pipe transistor. Furthermore, cell current may be improved by maintaining the pipe transistor in a turned on state.

In the drawings and specification, there have been disclosed various embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A semiconductor device comprising:
   a conductive layer;
   a plurality of word lines stacked on the conductive layer;
   a plurality of first channel layers configured to pass through the word lines; and
   a second channel layer formed in the conductive layer to connect the plurality of first channel layers, and having a higher impurity concentration than the plurality of first channel layers,
   wherein the conductive layer is configured to surround side and lower surfaces of the second channel layer.

2. The semiconductor device of claim 1, wherein the plurality of first channel layers each comprise an undoped polysilicon layer, and the second channel layer comprises a doped polysilicon layer.

3. The semiconductor device of claim 2, wherein the second channel layer comprises an N or P type polysilicon layer.

4. The semiconductor device of claim 1, wherein the second channel layer comprises:
   a plurality of first regions in contact with the plurality of first channel layers; and
   a second region disposed between the plurality of first regions, and having a higher impurity concentration than the plurality of first regions.

5. The semiconductor device of claim 4, wherein the plurality of first regions each comprise low-concentration N or P type impurities, and
   the second region comprises high-concentration N or P type impurities.

6. The semiconductor device of claim 4, wherein the plurality of first regions have semiconductor properties, and
   the second region has conductive properties.

7. The semiconductor device of claim 1, wherein the second channel layer has conductive properties.

8. The semiconductor device of claim 1, further comprising a slit configured to pass through the word lines, and disposed above the second channel layer.

9. The semiconductor device of claim 1, further comprising a dummy layer formed on the conductive layer, and configured to surround an upper surface of the second channel layer.

10. The semiconductor device of claim 9, wherein the dummy layer comprises an undoped polysilicon layer.

11. The semiconductor device of claim 1, wherein the conductive layer is configured to surround upper, side, and lower surfaces of the second channel layer.

12. The semiconductor device of claim 1, further comprising a first memory layer that may include all or some of a tunneling insulating layer, a charge storing layer, and a charge blocking layer that are disposed among the plurality of first and second channel layers and the word lines.

13. A semiconductor device comprising:
   source-side memory cells stacked along a first source-side channel layer;
   drain-side memory cells stacked along a first drain-side channel layer; and
   a conductive layer configured to connect the first source-side channel layer and the first drain-side channel layer;
   a source-side transistor connected between the source-side memory cells and the conductive layer; and
   a drain-side transistor connected between the drain-side memory cells and the conductive layer.

14. The semiconductor device of claim 13,
   wherein the source-side transistor is configured to electrically connect or disconnect the first source side channel layer and the conductive layer; and
   the drain-side transistor is configured to electrically connect or disconnect the first drain side channel and the conductive layer.

15. The semiconductor device of claim 13, wherein the source-side transistor and the drain-side transistor comprise second channel layers having a higher impurity concentration than the first source-side channel layer and the first drain-side channel layer.

16. The semiconductor device of claim 13, wherein the conductive layer has a higher electrical conductivity than the first drain-side channel layer and the first source-side channel layer.

17. The semiconductor device of claim 13, wherein a gate electrode of the source-side transistor and a gate electrode of the drain-side transistor are electrically connected.

\* \* \* \* \*